(12) United States Patent
Kearns et al.

(10) Patent No.: US 7,928,996 B2
(45) Date of Patent: Apr. 19, 2011

(54) CONTACT PRESSURE ANALYSIS TOOL

(75) Inventors: Donald A. Kearns, San Diego, CA (US); Christopher R. Ritchie, San Diego, CA (US)

(73) Assignee: Oracle America, Inc., Redwood City, CA (US)

( * ) Notice: Subject to any disclaimer, the term of this patent is extended or adjusted under 35 U.S.C. 154(b) by 857 days.

(21) Appl. No.: 11/868,035

(22) Filed: Oct. 5, 2007

(65) Prior Publication Data
US 2009/0091905 A1 Apr. 9, 2009

(51) Int. Cl.
*G09G 5/00* (2006.01)
(52) U.S. Cl. ........................... 345/629; 345/440
(58) Field of Classification Search .................. 345/440, 345/629–641
See application file for complete search history.

(56) References Cited

U.S. PATENT DOCUMENTS

| | | | | |
|---|---|---|---|---|
| 6,297,960 B1 * | 10/2001 | Moden et al. | ................. | 361/719 |
| 7,323,363 B1 * | 1/2008 | Kearns et al. | ................. | 438/109 |
| 2003/0132529 A1 * | 7/2003 | Yeo et al. | ..................... | 257/778 |
| 2005/0117305 A1 * | 6/2005 | Ulen et al. | .................... | 361/719 |

* cited by examiner

*Primary Examiner* — Xiao M Wu
*Assistant Examiner* — Charles Tseng
(74) *Attorney, Agent, or Firm* — Osha Liang LLP

(57) ABSTRACT

A method for improving load balance involves obtaining a graphical representation of a load distribution for contacts in an integrated circuit stack, analyzing the graphical representation of the load distribution to determine contact loads, where a contact load corresponds to a contact, and designing at least one component of the integrated circuit stack, based on the contact loads.

12 Claims, 11 Drawing Sheets

CONTACT PRESSURE ANALYSIS TOOL

BACKGROUND

The central processing unit (CPU) is an integrated circuit (IC), and is one of many integrated circuits included in electronic devices, such as modern computers (not shown). CPUs may perform operations on data and transmit the results to other integrated circuits. Therefore, the CPU's function is vital to the overall performance of a computer. The structure that surrounds the CPU within the computer also plays a key role in aiding and protecting the CPU in a computer.

FIG. 1 shows an integrated circuit housing, which includes typical components that surround the CPU in a computer or other electronic device. In the center of the figure, an IC, i.e., a chip (106), operates on top of a ceramic land grid array (CLGA) package (108). The CLGA package (108) contains small shaped metal pads (not shown) that connect to internal wires leading up to the chip (106). A socket (110) is an electrical interconnect that locates both the chip (106) and the CLGA package (108). The socket (110) allows the chip (106) to electrically interface with a printed circuit board (PCB) substrate (112) through the CLGA package (108). The PCB substrate (112) also contains metal pads (not shown) on the surface that correspond to the metal pads on the CLGA package (108) beneath the chip (106). Each individual connection that is made between the PCB substrate (12) and the CLGA package (108) components is called a contact (114). All of the aforementioned internal components surrounding the chip (106) may be collectively referred to as a stack.

Continuing with FIG. 1, the stack is typically surrounded by clamping hardware. Typical clamping hardware may include a heat dissipater (102) (e.g., a heat sink), a bolster plate (118), and typically as many as four fasteners (104). The heat dissipater (102) may be affixed to the bolster plate (118) via four fasteners (104) that fasten through the PCB substrate (112) (one on each corner of the bolster plate). The bolster plate (118) is typically a rigid element. In between the bolster plate (118) and the backside of the PCB substrate (112) is a thin insulator (116) made of plastic type material, which is typically included for its electrical properties.

When the fasteners (104) are tightened, the clamping hardware imparts a load on the contacts (114) between the chip (106) and the PCB substrate (112). Due to the large number of contacts (114) per circuit board and the force required for electrical function of each contact (114), the load applied by the clamping hardware may be quite large. For example, a typical 37 by 37 PCB substrate includes approximately 1,368 contacts. The finite stiffness of the clamping hardware may not allow for the load to be spread across all the contacts (114) and causes a non-uniform load that is concentrated on the four corners where the fasteners (104) are located.

The uniformity of load distribution applied to the contacts (114) is important for the electrical function of each individual contact (114). In an effort to improve load distribution, some conventional devices use a spherical or cylindrical curvature within the clamping hardware to redistribute the load. For example, a curvature may be placed in the center of the bolster plate. This allows a portion of the load to be offset from the four corners to the center of the clamping hardware. Alternatively, a flat, extremely stiff bolster plate may be used to spread the load away from the four corners.

SUMMARY

In general, in one aspect the invention relates to an integrated circuit housing. The integrated circuit housing comprises a first clamping hardware, a second clamping hardware operatively connected to the first clamping hardware, and an integrated circuit stack comprising a top portion and a bottom portion, where the first clamping hardware contacts the top portion and the second clamping hardware contacts the bottom portion, where at least one component of the integrated circuit housing is designed based on a plurality of contact loads corresponding to the plurality of contacts, and where a contact load of the plurality of contact loads is determined based on analysis of a graphical representation of a load distribution for the plurality of contacts.

In general, in one aspect the invention relates to a method for improving load balance. The method comprises obtaining a graphical representation of a load distribution for a plurality of contacts in an integrated circuit stack, analyzing the graphical representation of the load distribution to determine a plurality of contact loads, where a contact load of the plurality of contact loads corresponds to a contact of the plurality of contacts, and designing at least one component of the integrated circuit stack, based on the plurality of contact loads.

In general, in one aspect the invention relates to an interface for improving load balance. The interface comprises a graphical representation of a load distribution for a plurality of contacts in an integrated circuit stack, and a visualization of the plurality of contacts overlaid on the graphical representation of the load distribution for the plurality of contacts to determine a contact load for an individual contact of the plurality of contacts.

In general, in one aspect the invention relates to computer readable medium comprising instructions for improving load balance. The instructions comprising functionality for obtaining a graphical representation of a load distribution for a plurality of contacts in an integrated circuit stack, analyzing the graphical representation of the load distribution to determine a plurality of contact loads, wherein a contact load of the plurality of contact loads corresponds to a contact of the plurality of contacts, and designing at least one component of the integrated circuit stack, based on the plurality of contact loads.

Other aspects and advantages of the invention will be apparent from the following description and the appended claims.

DETAILED DESCRIPTION

Figure 1:
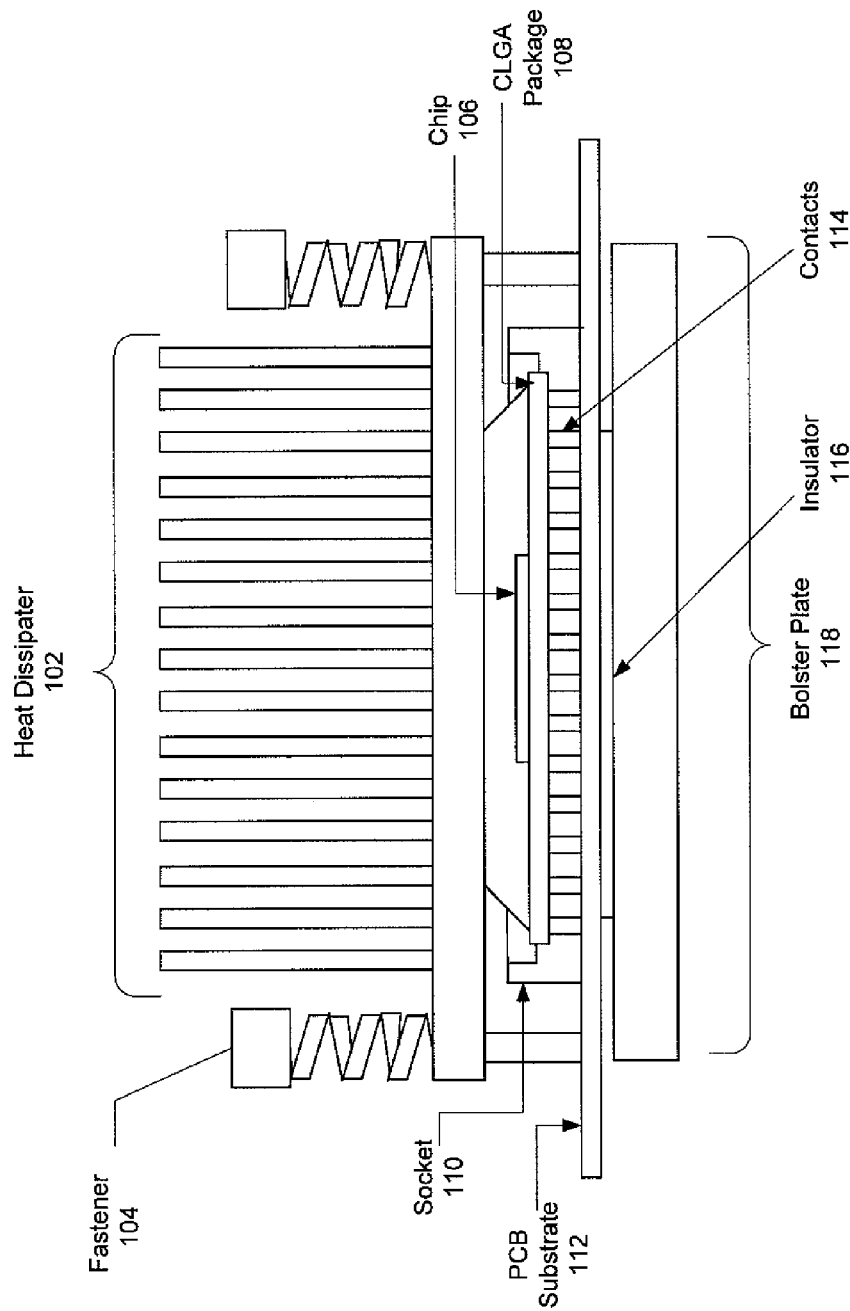
FIG. 1 shows a typical integrated circuit housing.

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 2:
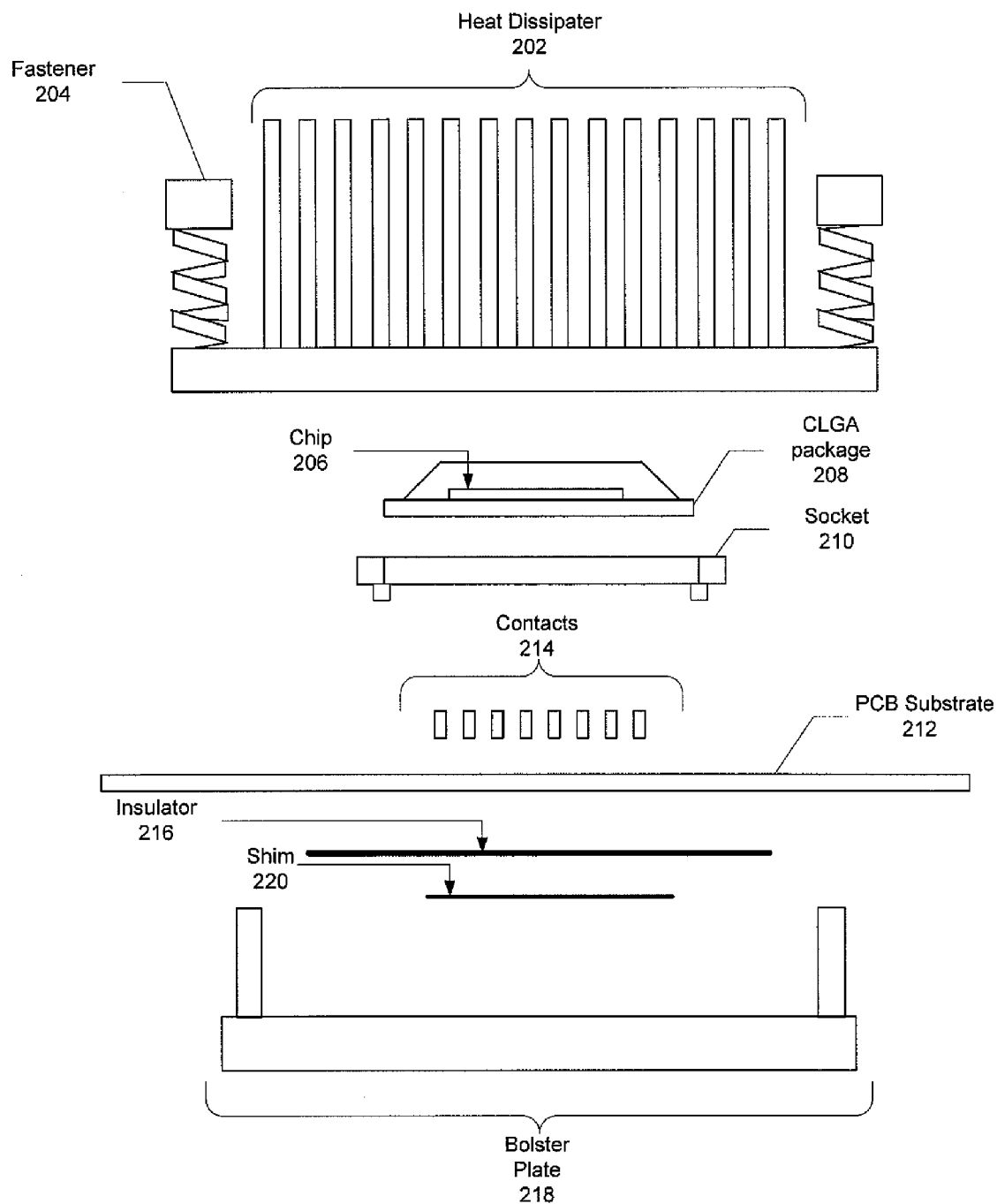
FIG. 2 shows an exploded view of an integrated circuit housing in accordance with one or more embodiments of the invention.

FIG. 2 shows an exploded view of the integrated circuit housing in one embodiment of the present invention. The integrated circuit housing typically includes a stack and surrounding clamping hardware. In the center of the figure, a chip (206) operates on top of a ceramic land grid array (CLGA) package (208). The CLGA package (208) contains small, shaped metal pads that connect to internal wires leading up to the chip (206). A socket (210) is an electrical interconnect that at least partially surrounds both the chip (206) and the CLGA package (208). The socket (210) allows the chip (206) to electrically interface with a printed circuit board (PCB) substrate (212) through the CLGA package (208). The PCB substrate (212) also contains metal pads (not shown) on the surface that correspond to the metal pads on the CLGA package (208) beneath the chip (206). Each individual connection that is made between the PCB substrate (212) and the CLGA package (208) components is called a contact (214). All of the aforementioned internal components surrounding the chip (206) may be collectively referred to as a stack.

Continuing with FIG. 2, the stack is typically affixed with clamping hardware. The clamping hardware characteristically surrounds the stack, and includes a heat dissipater (202) (e.g., a heat sink), a bolster plate (218), and as many as four fasteners (204). The heat dissipater (202) may be affixed to the bolster plate (218) via four fasteners (204) that fasten through the PCB substrate (212) (one on each corner of the bolster plate). The bolster plate (218) is typically a rigid element. Between the bolster plate (218) and the backside of the PCB substrate (212) is a thin insulator (216) made of plastic material, which is typically included for its electrical properties. Examples of plastic materials used as an insulator include polyester (e.g., Mylar), polyamide, and polycarbonate films.

In normal use, the clamping hardware may cause bending of the IC housing in various places when the hardware is tightened. This bending may be seen, for example, on the PCB substrate (212). This bending, along with other factors, results in non-uniform load distribution in the contacts (214).

In one or more embodiments of the invention, a shim (220), designed based on contact loads corresponding to each of the individual contacts (214), is placed between the PCB substrate (212) and the bolster plate (218) to improve the load distribution on the individual contacts (214) between the CLGA package (208) and the PCB substrate (212). The shim (220) may be affixed either above or below the insulator (216). Further, the shape, thickness, material, texture, and/or other characteristic of the shim (220) may be designed based on contact loads corresponding to each of the individual contacts (214) to balance the load.

A contact load, as discussed further below, corresponds to any information associated with a load for a single contact (214) which may include (but is not limited to) force, pressure, connection (e.g., electrical and mechanical), and friction information associated with the single contact (214). For example, in a scenario where different contacts have different contact loads, the thickness of a region of the shim aligned with a contact with a large load may differ from the thickness of a region of the shim aligned with a contact with a small load in order to balance the load equally between different contacts by decreasing the load on one contact and increasing the load on another contact. In another example, the shape of the shim may be designed based on the contact loads associated with each contact in order to balance the load over all the contacts. One skilled in the art will appreciate that the shim (220) may also be a load leveler, a contoured profile, a profiled shim, a load leveling shim, a contoured shim, etc.

A number of materials may be used to produce the shim (220). For example, the shim may be produced using a polyester film (e.g., Mylar), a polyamide, a polycarbonate film, or any other material that includes the thermal, mechanical, and electrical properties required to be used in an electrical device. In addition, the materials from which the shim (220) is made, may allow the shim (220) to remain thick and retain a high modulus over a varying temperature and pressure range.

Figure 3A:
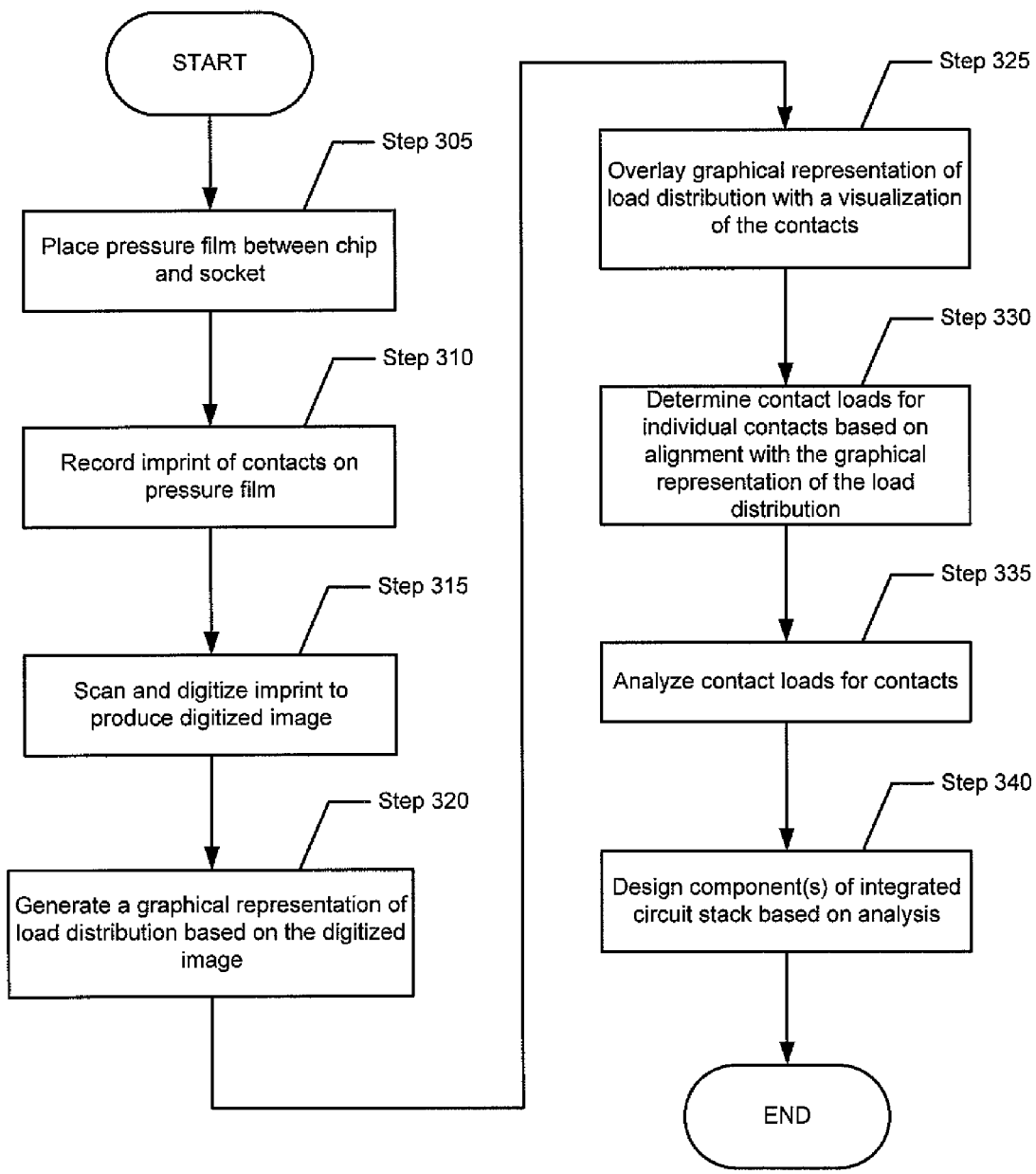
FIG. 3A shows a flow chart for designing a shim in accordance with one or more embodiments of the invention.

FIG. 3A shows a flow chart for designing a shim in accordance with one or more embodiments of the invention. In one or more embodiments of the invention, one or more of the steps described below may be omitted, repeated, and/or performed in a different order. Accordingly, the specific arrangement of steps shown in FIG. 3 should not be construed as limiting the scope of the invention.

Initially, a piece of pressure film is placed between the chip and the socket in accordance with one or more embodiments of the invention (Step 305). One skilled in the art will appreciate that the pressure film may also be placed between the socket and the PCB substrate. Subsequently, an imprint is obtained by applying load to the contacts via tightening of the clamping hardware, in accordance with one or more embodiments of the invention (Step 310). Next, the imprint is scanned and digitized using software to produce a digitized image (Step 315).

Figure 4A:
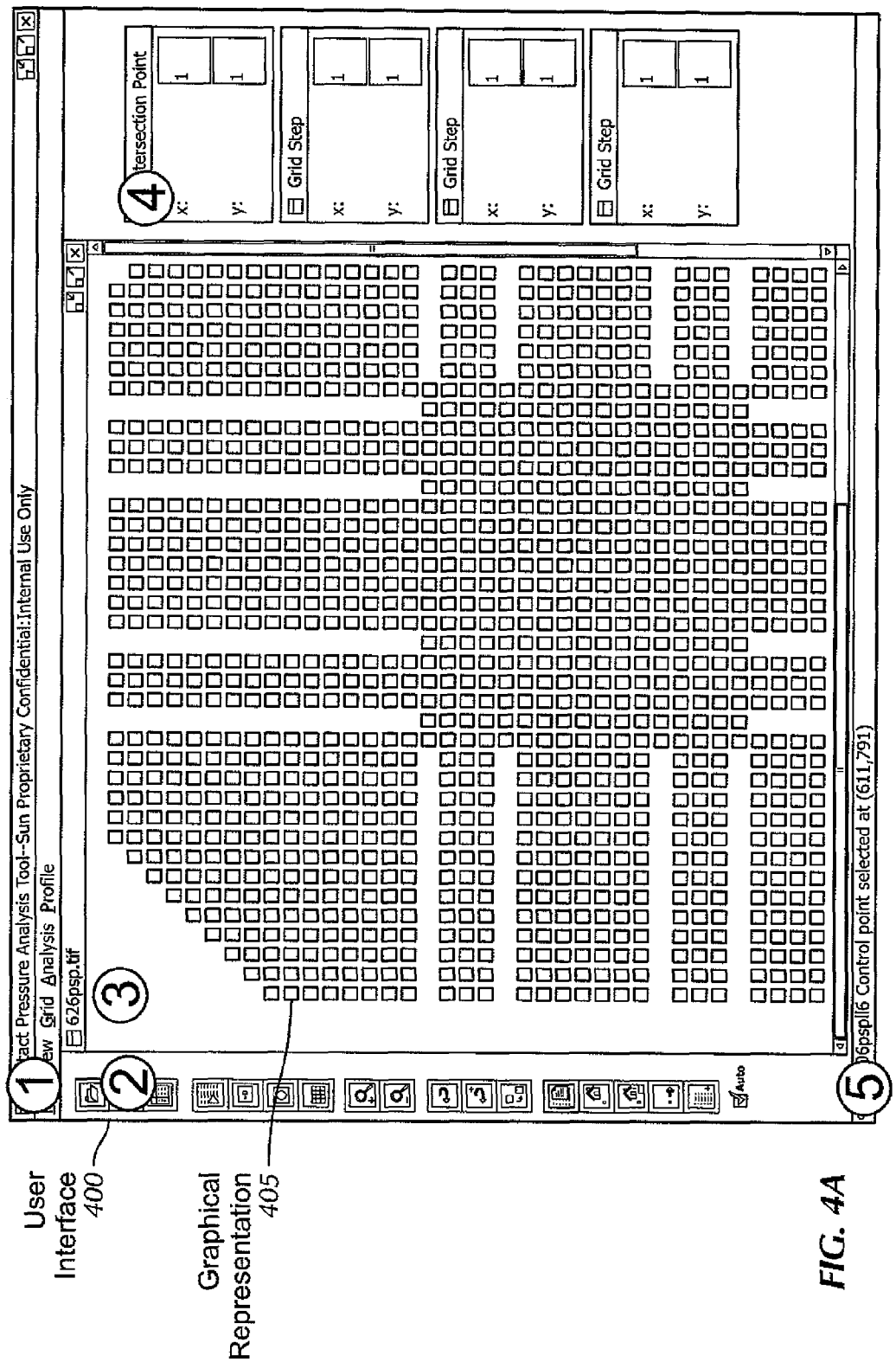
FIGS. 4A-4F show an example of an interface in accordance with one or more embodiments of the invention.

The digitized image is then analyzed pixel by pixel over a group of pixels in an analysis region to generate a graphical representation of the load distribution as shown in FIG. 4A (Step 320). For example, the load distribution may be displayed in a graphical representation using a color intensity parameter or other scheme to distinguish disproportionate areas of load distribution. In a graphical representation using a color intensity scheme, the areas with a heavy load may correspond to a more intense color or more colored pixels in comparison to an area with a low load. In other words, areas of low color intensity signify low load distribution among the contacts, and vice versa.

Continuing with FIG. 3A, the graphical representation of the load distribution is overlaid with a visualization of the contacts, in accordance with one or more embodiments of the invention (Step 325). The visualization of the contacts may be in any shape including regular and irregular patterns depending on the spacing of the contacts. In one or more embodiments of the invention, the contacts are configured in a grid and accordingly the visualization of the contacts may be in a similar grid pattern. Overlaying the graphical representation with the visualization of contacts is shown in detail in FIG. 3B and discussed below. Overlaying the graphical representation of the load distribution with the visualization of contacts results in each contact being aligned with a portion of the graphical representation. Further, overlaying the graphical representation of the load distribution with the visualization of contacts may be manual or automatic.

Based on alignment of a contact with the graphical representation of the load distribution, information for a load associated with the contact is used to determine a contact load, in accordance with one or more embodiments of the invention (Step 330). For example, a load associated with a contact may be determined using the color intensity for a region of the graphical representation aligned with the contact. In this example, the more intense the color for a region of the graphical representation, the greater the load associated with the corresponding contact.

The contact loads may then be used to analyze information associated with the load distribution across multiple contacts, in accordance with one or more embodiments of the invention (Step 335). One or more embodiments of the invention, may allow for analysis of any quasi-planar field of loading points. The contact loads may be analyzed using a statistical, qualitative and/or quantitative analysis of one or more contact loads. The analysis may also include visual display associated with the contact loads. Examples of visual displays associated with the contact loads include, but are not limited to, a pressure distribution visualization, a force distribution visualization and/or a histogram. In one or more embodiments of the invention, a three dimensional map of the load distribution may be determined based on the contact loads. For example, the x and y dimensions may correspond to the location of the contact and the z dimension may correspond to the load associated with individual contacts.

Lastly, the contact loads (including any analysis associated with the contact loads) are used to design or modify one or more components of an integrated circuit stack that improves load balance across the contacts (Step 340). For example, a shim may be configured based on individual contact loads associated with the contacts. The shape, thickness, texture, density, resistance, and/or other characteristics may be chosen to increase or decrease the load associated with an individual contact and/or a region of contacts. In one or more embodiments of the invention, the shim may be designed based on a three dimensional map of the load distribution discussed above in Step 335. The shim may be constructed by molding, cutting, or stacking sheets of material. The sheets of material may be held together with the same acrylic adhesive used to attach the shim to the insulator. The shim may also be constructed by cutting the center of the shim in a specific pattern and then folding back the flaps so that they form raised areas that shape the load in order to reduce the number of parts. Using this technique, the number of materials is reduced because layers of plastic material are no longer needed to form raised areas. A laser or other high precision device may also be used to remove material from the shim in a particular pattern.

In another example, a bolster plate design may be optimized by varying known bolster parameters to improve load balance. Further, the shape (e.g., flatness and/or thickness) of the PCB substrate may be designed and/or modified based on the analysis of the contact loads for each individual contact. Furthermore, the contact loads may be used to modify a socket in an integrated circuit housing stack. Each type of electrical contact in sockets, as well as the characteristics of the molded plastic socket housing, affect the performance of the electrical interface in concert with adjoining surfaces. One or more embodiments of the invention may be used to identify what aspects of the socket are impacting performance with respect to loading state. In yet another example, the contact loads may be used to review the impact circuit boards have on contact loading and/or assess impacts of board surface features on contact loading such as traces, vias, thieving, printing, mask, etc. The load distribution analysis may also help measure total contact loading in the socket, as well as uniformity affects that loading hardware, springs and fasteners, may have on contact loading for a given socket, board, package, and bolster plate.

The analysis of the contact loads may allow for measuring the effects of any un-intended load re-distribution due to materials placed in the socket compression stack (e.g., adhesive labels). Lastly, the analysis of the contact loads may also be used to understand the variability of various parameters or given instances of a product (e.g., in regards to socket performance), understand potential causes of failing hardware assemblies, and/or assess manufacturing and assembly process capability.

Figure 3B:
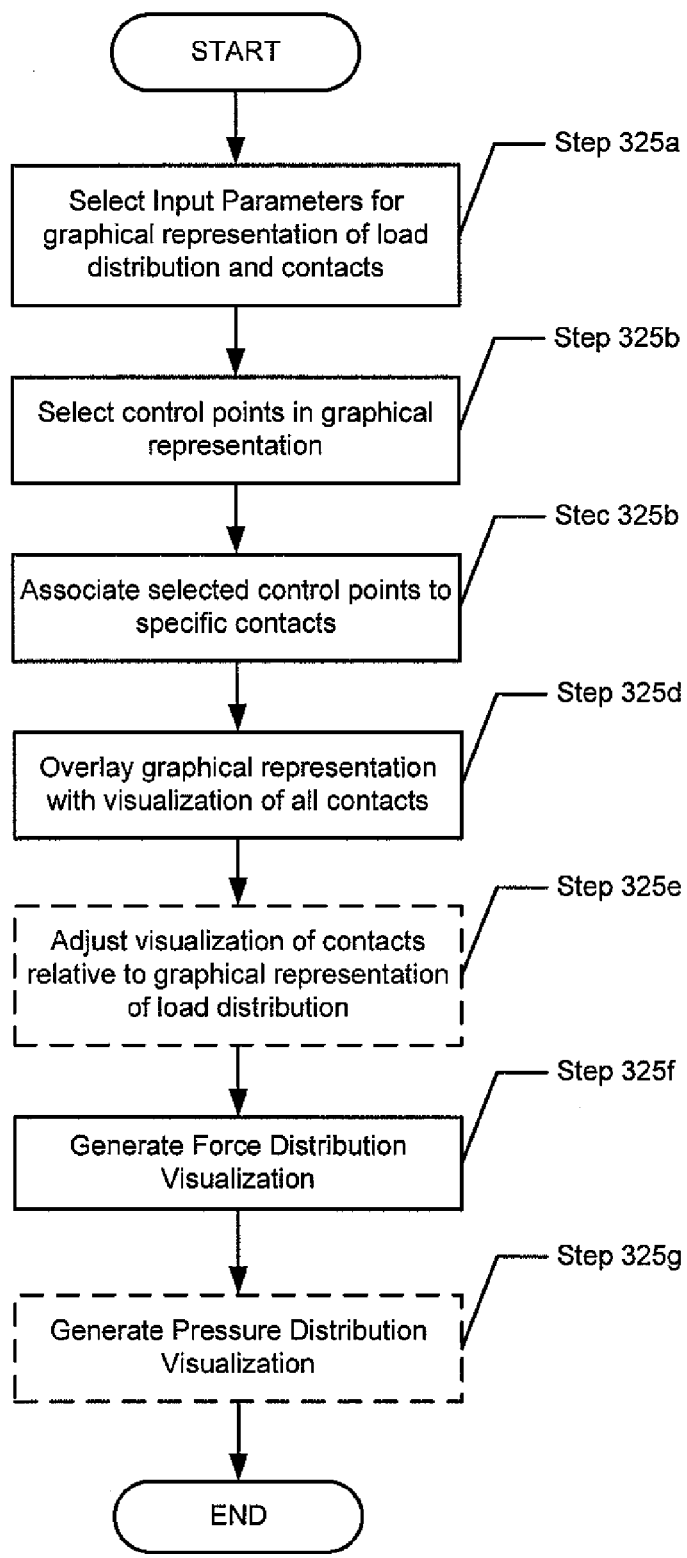
FIG. 3B shows an example of a flow chart for overlaying a graphical representation of a load distribution with a visualization of contacts.

FIG. 3B shows a flow chart for overlaying the graphical representation of the load distribution with a visualization of the contacts, in accordance with one or more embodiments of the invention. In one or more embodiments of the invention, one or more of the steps described below may be omitted, repeated, and/or performed in a different order. Accordingly, the specific arrangement of steps shown in FIG. 3B should not be construed as limiting the scope of the invention.

First, input parameters are selected for the relevant graphical representation of the load distribution and the visualization of the contacts (Step 325a). Examples of the input parameters include but are not limited to file selections, film properties, grid properties, force and pressure calculation equations, selection of automatic features associated with aligning the contacts to the graphical representation of the load distribution, and filter properties.

Figure 4B:
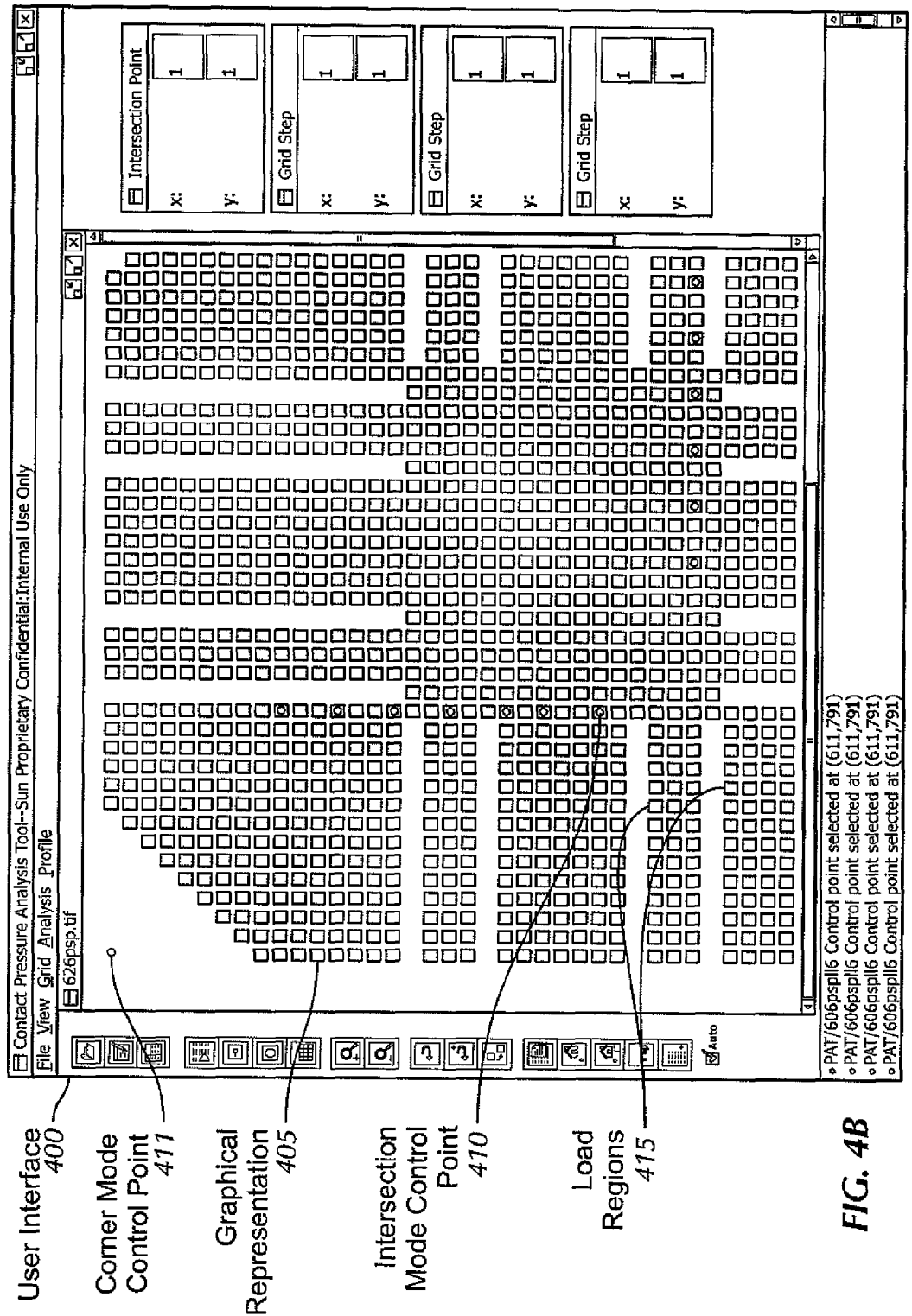

Next, control points corresponding to regions with a load are selected on the graphical representation of the load distribution (Step 325b) and associated with specific contacts, in accordance with one or more embodiments of the invention (Step 325c). As shown in FIG. 4B, each local load region is represented by circular spots throughout the graphical representation of the load distribution. The selected control points may correspond to corner contacts (i.e., corner mode control points) and/or the selected control points may correspond to contacts in a single row and/or single column (i.e., intersection mode control points) as shown in FIG. 4B. In addition, the control points may then be associated to specific contacts using any referencing scheme. For example, the contacts, if in a grid, may be referred to using an x and y coordinate and associated with a selected control point. In one or more embodiments of the invention, the accuracy of the control point selections may be improved automatically using a software tool. For example, a selected control point may be centered by the software tool around the local region with a visualized load. In one or more embodiments of the invention, overlaying the graphical representation of the load distribution may be automated and may not require selection of control points.

Figure 4C:
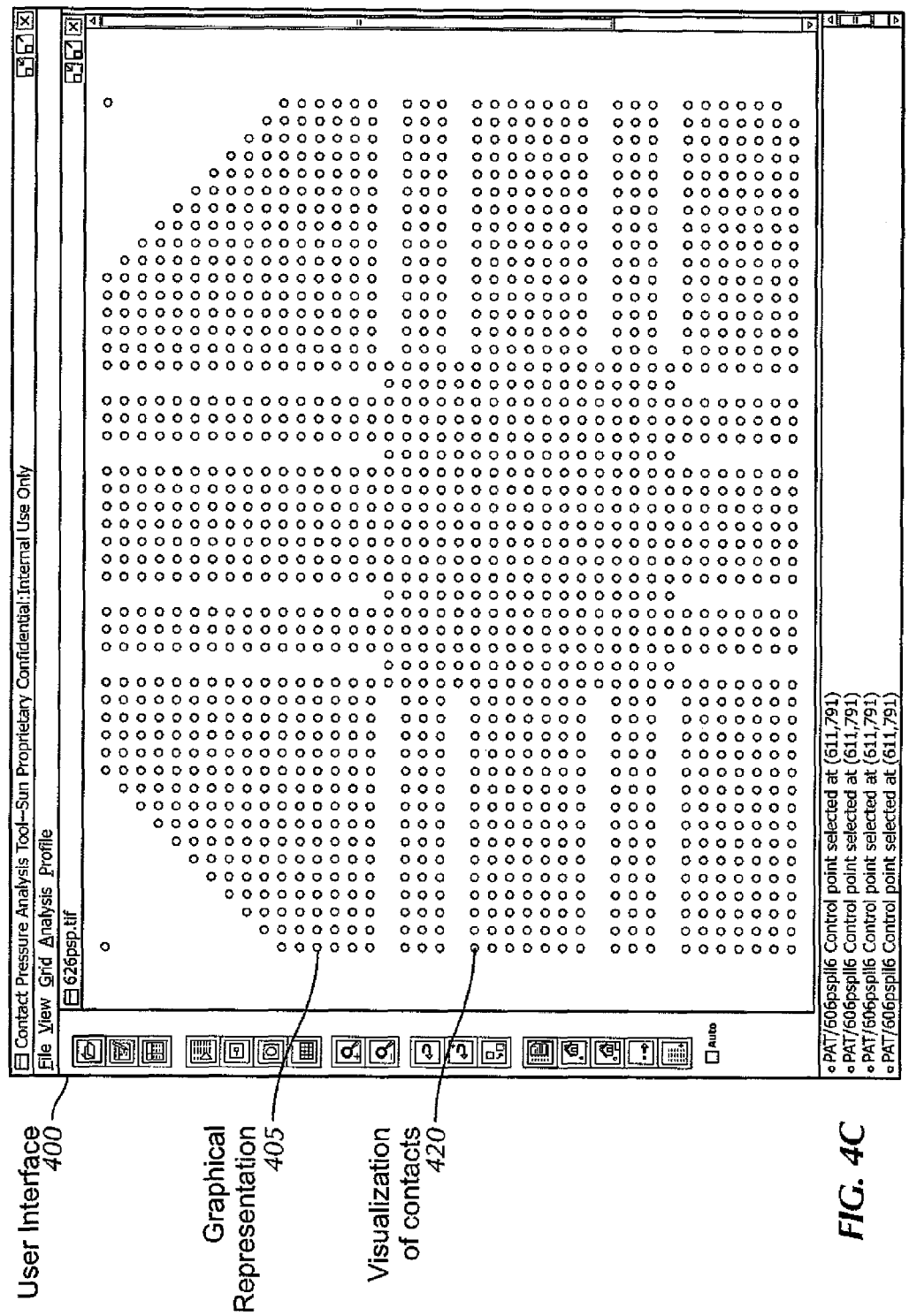

Continuing with FIG. 3B, once a predetermined number of control points are selected, the graphical representation of the load distribution is overlaid with a visualization of all the contacts based on the alignment of the control points associated with specific contacts as shown in FIG. 4C, in accordance with one or more embodiments of the invention (Step 325d). For example, the location of specific contacts in the visualization determined based on the control points may used to determine the location of the remaining contacts by positioning the remaining contacts relative to the specific contacts in the visualization. To improve the accuracy of a contact alignment with the corresponding portion of the graphical representation of the load distribution, the visualization of the contacts may be adjusted relative to graphical representation of the load distribution (Step 325e). Any input means such as a mouse, keyboard, and/or touch screen may be used to adjust the visualization of contacts. In one or more embodiments of the invention, the manual adjustment of the visualization of contacts may be performed using the corner points, also known as "handles."

In one or more embodiments of the invention, the adjustment may be automated or manually performed by a user. For example, after the graphical representation of the load distribution is overlaid with the visualization of the contacts, a software tool may automatically adjust the visualization of contacts to the best alignment of the contacts to local regions within the graphical representation with a load. The adjustment may include movement of all contacts within the visualization of contacts while maintaining the distance between the contacts and/or movement of individual contacts within the visualization of contacts. In one embodiment of the invention, the adjustment may be restricted to a maximum change (e.g., a maximum length the contacts can be moved from the starting position prior to adjustment).

Figure 4D:
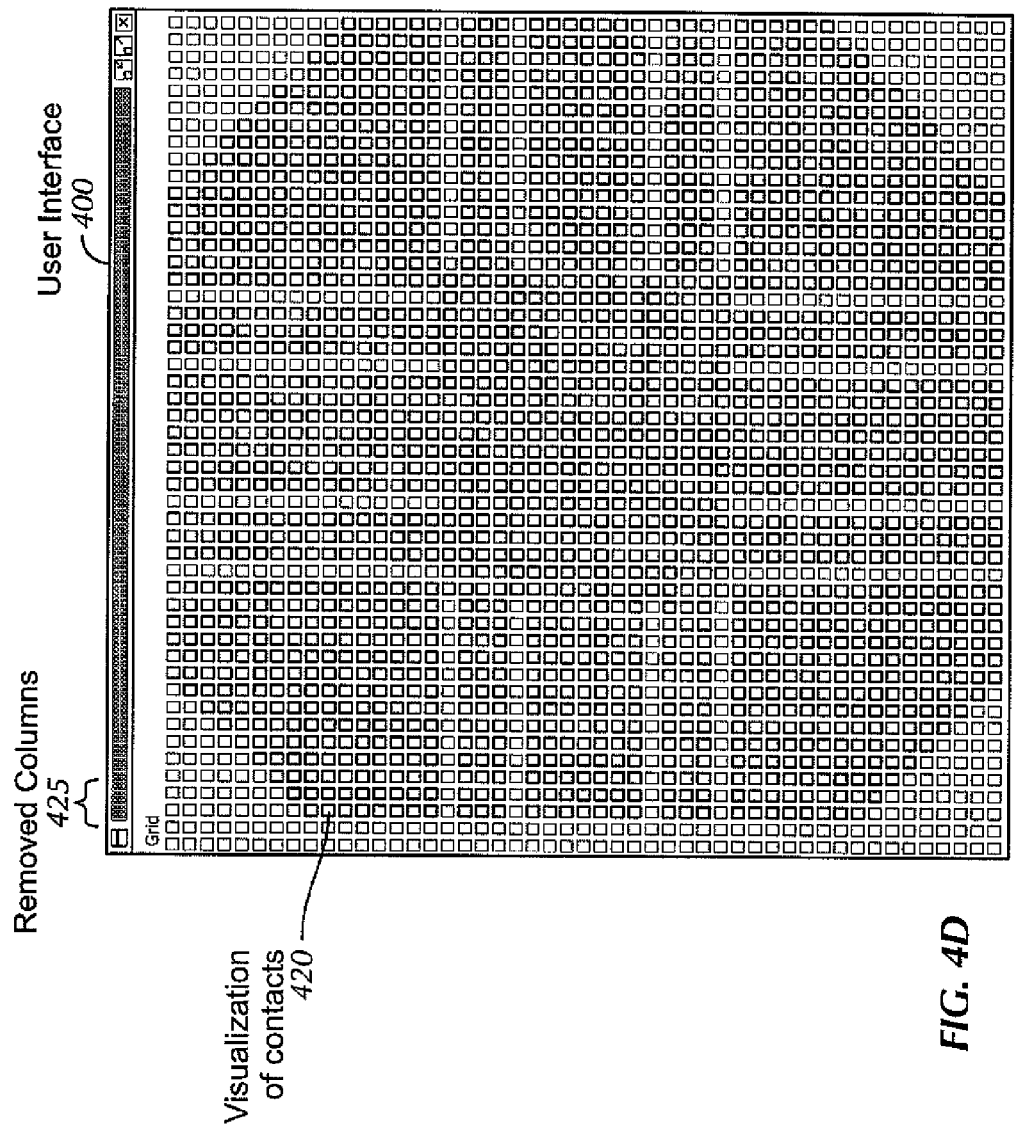

Furthermore, individual contacts within the visualization of contacts may also be all together removed. For example, if the graphical representation of the load distribution does not accurately reflect the load associated with a contact, the contact may be removed all together from the visualization of the contacts. In another scenario, where a group of contacts (e.g., two columns of contacts) is missed by the pressure film and accordingly the graphical representation of the load distribution does not accurately reflect the load distribution corresponding to the missed group of contacts, the missed group of contacts may be removed from the visualization of contacts overlaid on the graphical representation of the load distribution as shown in FIG. 4D.

Figure 4E:
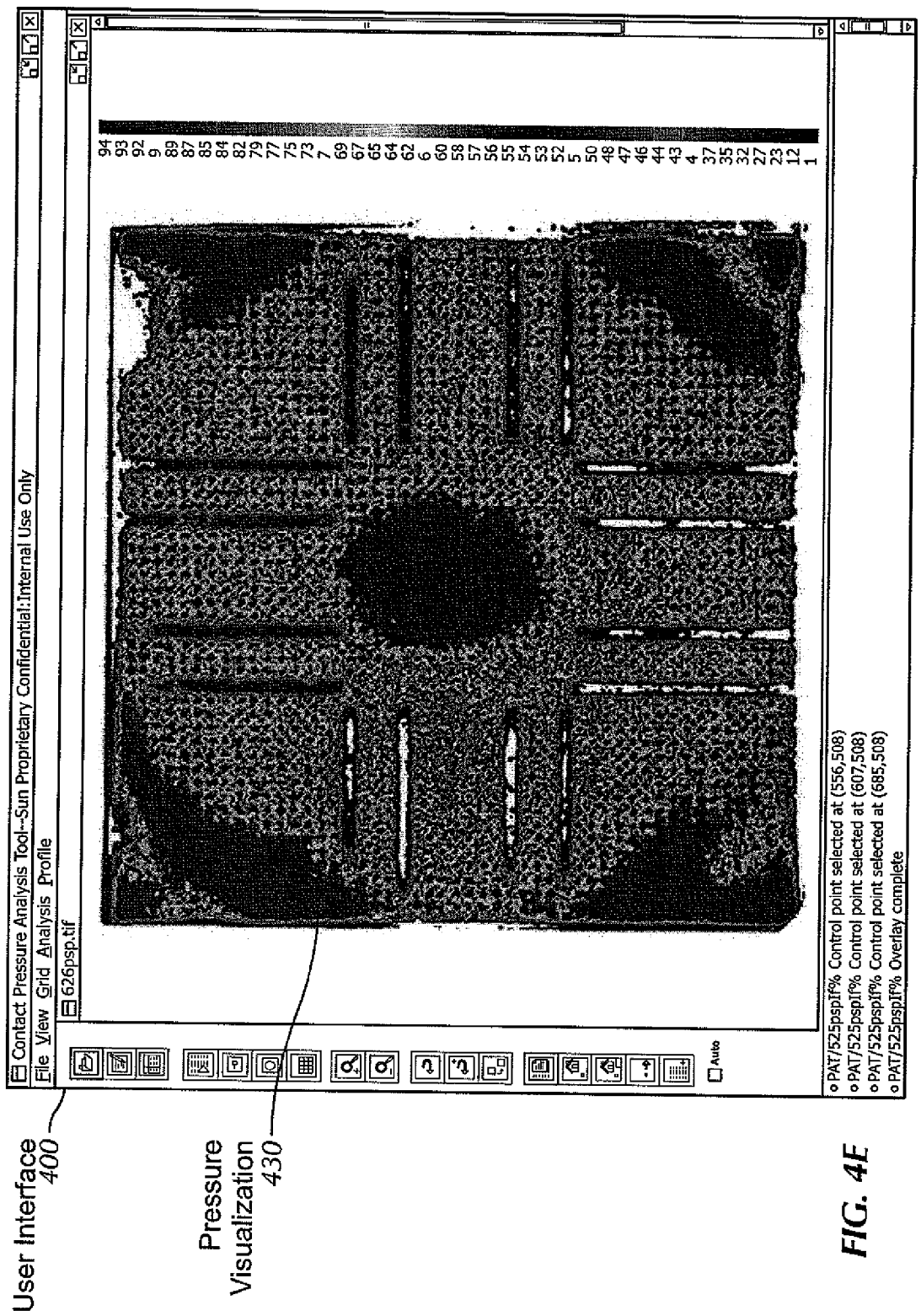

Continuing with FIG. 3B, a pressure distribution visualization may be generated using the graphical representation of the load distribution based on the digitized image (Step 325f) as shown in FIG. 4E. In one or more embodiments of the invention, a pressure distribution visualization corresponds to a graphical representation of the load distribution on the film.

Figure 4F:
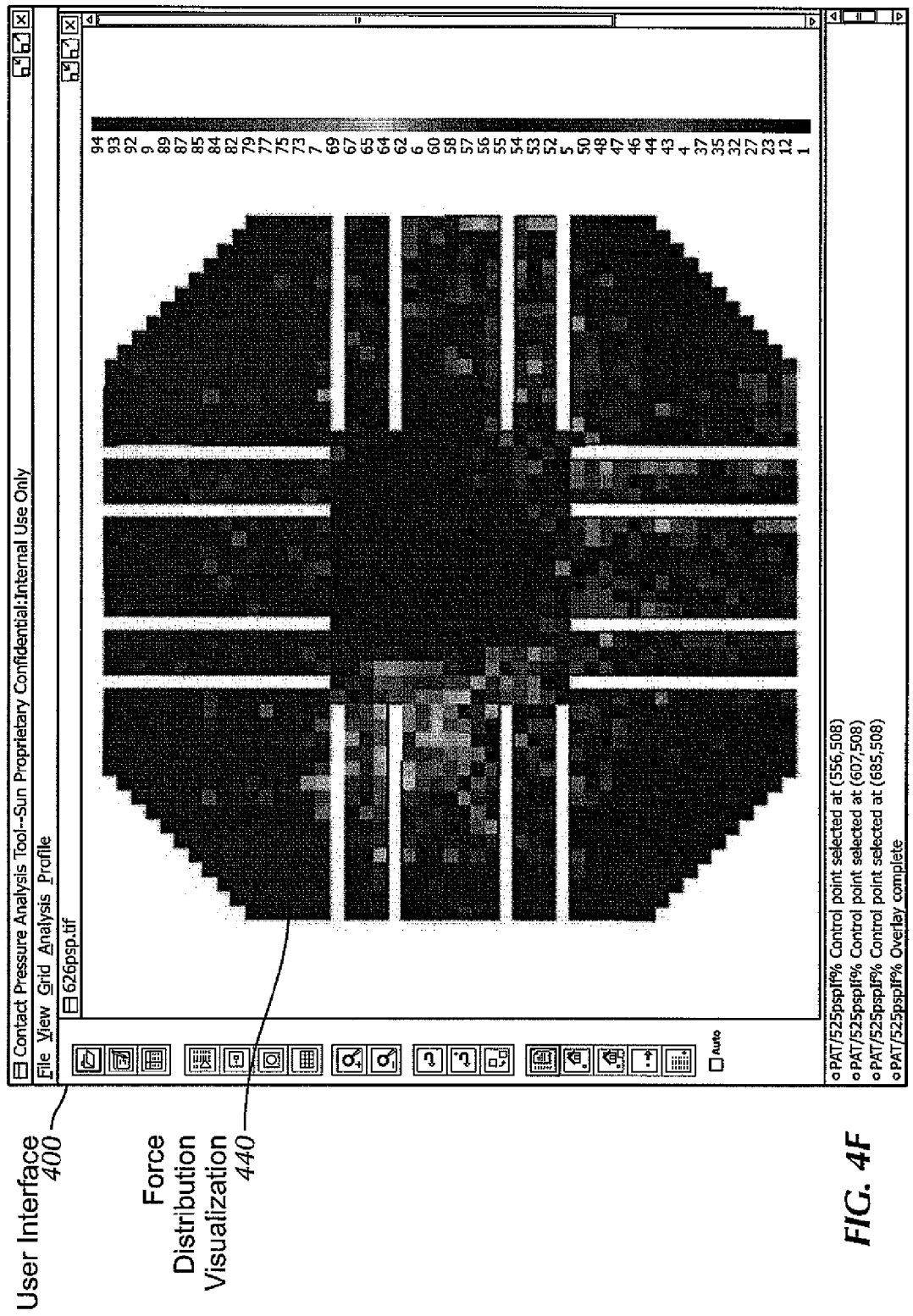

In one or more embodiments of the invention, the graphical representation of the load distribution overlaid with a visualization of the contacts may be used to generate a force distribution visualization (Step 325g), as shown in FIG. 4F. A force distribution visualization corresponds to a graphical representation of the force applied to each contact.

FIGS. 4A-4D show examples of an interface in accordance with one or more embodiments of the invention, as discussed above. The user interface (400) corresponds to any sort of interface adapted for use to access the system and any services provided by the system in accordance with one or more embodiments of the invention. The user interface (400) may be a web interface, graphical user interface (GUI), command line interface, or other interface accessible through a computer system. In one or more embodiments of the invention, the user interface (400) includes one or more web pages that can be accessed from a computer with a web browser and/or internet connection. Alternatively, the user interface (400) may be an application that resides on a computing system, such as personal computers (PCs), mobile phones, personal digital assistants (PDAs), and/or other digital computing devices of the users, and that communicate with the system via one or more network connections and protocols. Regardless of the architecture of the system, communications between the system and the user interface (400) may be secure.

Specifically, FIG. 4A shows a user interface (400) with a graphical representation (405) of a load distribution. FIG. 4B shows control points (410) selected on a the graphical representation (405). In one or more embodiments of the invention, the intersection mode control points (410) and the corner mode control points (411) are associated with load regions (415) that generally correspond to a loads for contacts in an integrated circuit stack (not shown). The load regions, in this example, are represented by circular colored shapes. The regions with a higher load (i.e., corresponding to contacts with a higher load) are represented by darker or more concentrated circular shapes. In one or more embodiments of the invention, the intersection mode control points (410) correspond to contacts in a single row and/or a single column and the corner mode control points (411) correspond to contacts in the corners. FIG. 4C shows a graphical representation (405) of load distribution overlaid with a visualization of contacts (420) shown as multiple circular shaped objects. The portion of the graphical representation (405) aligned with individual contacts from the visualization of contacts (420) are used to determine contact loads for the corresponding individual contacts. FIG. 4D shows a visualization of contacts (420), with removed columns (425). As discussed above, columns may be removed to ignore erroneous data associated with the graphical representation of the load distribution. For example, if a pressure film did not accurately produce load data associated with one or more contacts. FIG. 4E shows a pressure distribution visualization corresponding to a load distribution on the pressure film. FIG. 4F shows a force distribution visualization corresponding to a force (i.e., load) associated with each individual contact.

Figure 5:
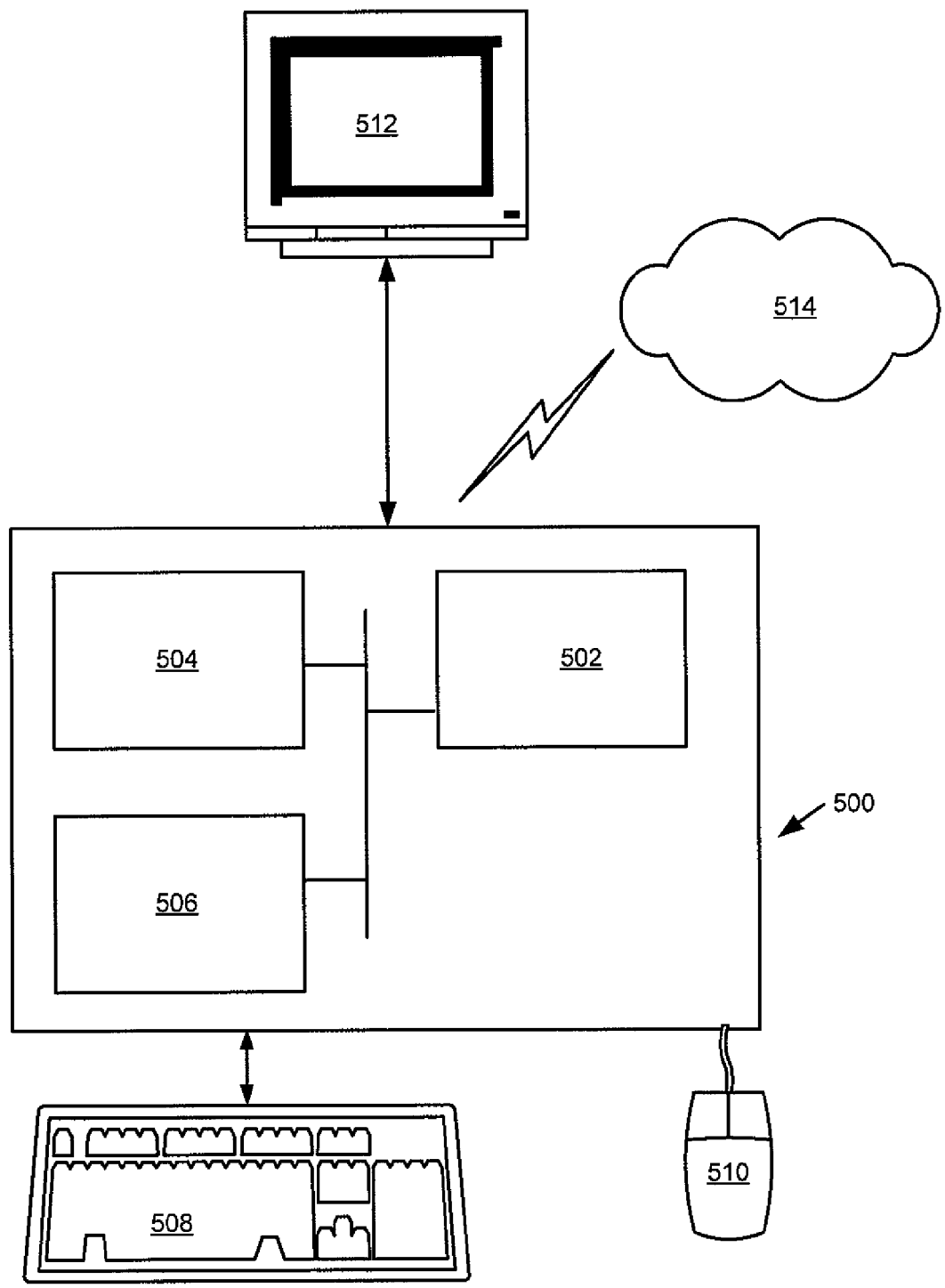
FIG. 5 shows a system in accordance with one or more embodiments of the present invention.

The invention may be implemented on virtually any type of computer regardless of the platform being used. For example, as shown in FIG. 5, a computer system (500) includes a processor (502), associated memory (504), a storage device (506), and numerous other elements and functionalities typical of today's computers (not shown). The computer (500) may also include input means, such as a keyboard (508) and a mouse (510), and output means, such as a monitor (512). The computer system (500) is connected to a LAN or a WAN (e.g., the Internet) (514) via a network interface connection. Those skilled in the art will appreciate that these input and output means may take other forms.

Further, those skilled in the art will appreciate that one or more elements of the aforementioned computer system (500) may be located at a remote location and connected to the other elements over a network. Further, the invention may be implemented on a distributed system having a plurality of nodes, where each portion of the invention (e.g., object store layer, communication layer, simulation logic layer, etc.) may be located on a different node within the distributed system. In one embodiment of the invention, the node corresponds to a computer system. Alternatively, the node may correspond to a processor with associated physical memory. The node may alternatively correspond to a processor with shared memory and/or resources. Further, software instructions to perform embodiments of the invention may be stored on a computer readable medium such as a compact disc (CD), a diskette, a tape, a file, or any other computer readable storage device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for improving load balance comprising:
   obtaining, by a processor, a graphical representation of a load distribution for a plurality of contacts in an integrated circuit stack, wherein the graphical representation of the load distribution is obtained using a pressure imprint of the plurality of contacts;
   analyzing the graphical representation of the load distribution to determine a plurality of contacts loads, wherein a contact load of the plurality of contact loads corresponds to a contact of the plurality of contacts, wherein analyzing the graphical representation of the load distribution to determine the plurality of contact loads comprises overlaying the graphical representation with a visualization of the plurality of contacts; and designing at least one component of the integrated circuit stack, based on the plurality of contact loads.

2. The method of claim 1, further comprising placing a shim, designed based on the plurality of contact loads, into the integrated circuit stack to improve the load balance associated with the plurality of contacts.

3. The method of claim 1, wherein the contact load of the plurality of contact loads corresponds to a force associated with the contact of the plurality of contacts.

4. The method of claim 1, wherein overlaying the graphical representation of the load distribution with a visualization of the plurality of contacts comprises: selecting at least one control point in the graphical representation of the load distribution; associating the control point with a first contact of the plurality of contacts; and overlaying a visualization of a second contact of the plurality of contacts relative to the control point based on a physical space between the first contact and the second contact.

5. The method of claim 4, wherein the control point is at least one from a group consisting of:
    a corner mode control point; and
    an intersection mode control point.

6. The method of claim 1, further comprising adjusting the visualization of the plurality of contacts relative to the graphical representation of the load distribution to improve alignment of the visualization of each of the plurality of contacts with a corresponding region of the graphical representation associated with the contact.

7. The method of claim 1, further comprising obtaining load information associated with the contact based on the region of the graphical representation aligned with the contact.

8. The method of claim 1, wherein overlaying the graphical representation with a visualization of the plurality of contacts is automated.

9. The method of claim 1, further comprising at least one from the group consisting of moving the contact of the plurality of contacts in the visualization of the plurality of contacts and removing the contact of the plurality of contacts from the visualization of the plurality of contacts.

10. The method of claim 1, further comprising generating at least one selected from a group consisting of a pressure distribution, a force distribution, and a histogram.

11. A non-transitory computer readable medium comprising instructions for improving load balance, wherein the instructions comprise functionality for:
    obtaining a graphical representation of a load distribution for a plurality of contacts in an integrated circuit stack, wherein the graphical representation of the load distribution is obtained using a pressure imprint of the plurality of contacts;
    analyzing the graphical representation of the load distribution to determine a plurality of contacts loads, wherein a contact load of the plurality of contact loads corresponds to a contact of the plurality of contacts, wherein analyzing the graphical representation of the load distribution to determine the plurality of contact loads comprises overlaying the graphical representation with a visualization of the plurality of contacts; and
    designing at least one component of the integrated circuit stack, based on the plurality of contact loads.

12. The computer readable medium of claim 11, wherein the instructions further comprising functionality for adjusting the visualization of the plurality of contacts relative to the graphical representation of the load distribution to improve alignment of the visualization of each of the plurality of contacts with a corresponding region of the graphical representation associated with the contact.

* * * * *